United States Patent [19]

Nakamura et al.

[11] Patent Number: 5,723,364
[45] Date of Patent: Mar. 3, 1998

[54] METHOD FOR WIRE-BONDING A COVERED WIRE

[75] Inventors: Osamu Nakamura, Kokubunji; Kazumasa Sasakura, Musashi Murayama, both of Japan

[73] Assignee: Kabushiki Kaisha Shinkawa, Tokyo, Japan

[21] Appl. No.: 759,230

[22] Filed: Dec. 5, 1996

[30] Foreign Application Priority Data

Dec. 5, 1995 [JP] Japan .................................. 7-344552

[51] Int. Cl.⁶ .................................................. H01L 21/60
[52] U.S. Cl. .......................... 437/209; 437/211; 437/214; 437/217
[58] Field of Search ................................ 437/209, 211, 437/214, 215, 217, 218

[56] References Cited

U.S. PATENT DOCUMENTS

| 4,842,662 | 6/1989 | Jacodi ................... 437/209 |
| 5,310,702 | 5/1994 | Yoshida et al. .......... 437/211 |
| 5,527,742 | 6/1996 | Weiler et al. ............ 437/211 |

FOREIGN PATENT DOCUMENTS 2-213146  8/1990  Japan .

*Primary Examiner*—Kevin Picardat
*Attorney, Agent, or Firm*—Koda And Androlia

[57] ABSTRACT

To assure a continuity of bonding by preventing buckling of a covered wire and slipping-off of the covered wire from a second clamper, after a first clamper is closed and the second clamper is opened in a step in which a capillary and first clamper are raised to a ball formation level, the capillary and first clamper are lowered, thus pulling the covered wire downward so that the covered wire does not stick to the second clamper; and then the capillary and first clamper are raised to the ball formation level.

2 Claims, 4 Drawing Sheets

METHOD FOR WIRE-BONDING A COVERED WIRE

BACKGROUND OF THE INVENTION

1. Field of the Invention

The present invention relates to a method for wire-bonding a covered wire.

2. Prior Art

Conventionally, as a method for wire-bonding a covered wire, a method disclosed in Japanese Patent Application Laid-Open (Kokai) No. 2-213146 has been known. This method is disclosed in FIG. 5. A covered wire 1 is comprised of a core wire 1a, which is a conductor, and a covering-film 1b, which consists of a macromolecular resin material with electrical insulating properties and is covered as a coating around the circumference of the core wire 1a. The covered wire 1 is supplied from a wire spool, which is not shown in the Figures, and passed through a capillary 4 via a second clamper 2, which is for holding the wire, and a first clamper 3, which is for cutting the wire. The covered wire 1 thus passing through the capillary 4 is connected to the pad of a semiconductor pellet 5 and the lead 6a of a lead frame 6.

A pair of discharge electrodes 7 and 8 for removing the covering-film and for forming a ball include, as shown in FIG. 4, electromagnetic parts 71 and 81 as discharge terminals, and the upper and lower surfaces of the electromagnetic parts 71 and 81 are held by insulating parts 72 and 82 which have electrical insulating properties. Here, one of the discharge electrodes 7 is used exclusively for removing the covering-film 1b, while the other discharge electrode 8 functions as a dual-purpose electrode so that it is used both for removing the covering-film 1b and for forming a ball. As a result, the upper surface of the discharge electrode 8 has a structure provided with an exposed discharge surface, and this exposed portion functions as an electrode surface 8a for forming a ball.

FIG. 5(a) shows a state in which a ball 1c has been formed at the tip of the covered wire 1, and the first clamper 3 and second clamper 2 are opened. Furthermore, a removed portion (exposed portion 1d) has been formed beforehand by a method which will be described below in an area extending for a predetermined distance from the tip of the covered wire 1. As seen from FIGS. 5(a) to 5(b), the capillary 4 is lowered so that the ball 1c is bonded to the first bonding point of a pad of the semiconductor pellet 5. Next, the capillary 4 is raised, moved to a point above one of the leads 6a of the lead frame 6 and then lowered; and as shown in FIG. 5(c), the exposed portion 1d is bonded to the second bonding point of the lead 6a.

Next, as shown in FIG. 5(d), the capillary 4 is raised by a distance $L_1$ from the surface of the lead 6a. This distance $L_1$ is calculated by use of information concerning the first and second bonding positions and the initial set conditions of the bonding apparatus, etc., as described in Japanese Patent Application Laid-Open No. 2-213146. When the capillary 4 is thus raised by a distance $L_1$, the first clamper 3 closes and holds the covered wire 1. Next, with the first clamper 3 closed, the clamper 3 is raised together with the capillary 4; and as shown in FIG. 5(e), the covered wire 1 is cut from the base area of the second bonding point. In this case, the first clamper 3 and the capillary 4 are raised so that an intended covering-film removal area 1e comes between the pair of discharge electrodes 7 and 8. As result, the covered wire 1 protrudes from the tip of the capillary 4 by the length $L_1$, and a part of the exposed portion 1d remains at the tip of the covered wire 1.

Next, as shown in FIG. 5(f), the pair of discharge electrodes 7 and 8 are moved in close to the covered wire 1 from both sides in a non-contact state. A voltage is then applied to the discharge electrodes 7 and 8 so that an electric discharge is caused to take place between the electromagnetic parts 71 and 81 and the core wire 1a with the covering-film 1b in between. As a result of the discharge energy, as shown in FIG. 5(g), i portion of the covering-film 1b located at a predetermined position on the covered wire 1 is removed. In other words, the exposed portion 1d shown in FIG. 5(a) is formed. Next, as shown in FIG. 5(g), the discharge electrodes 7 and 8 are withdrawn in a direction away from the covered wire 1.

Next, as shown by chain lines, the second clamper 2 is closed, and the first clamper 3 is opened. Afterward, as shown in FIG. 5(h), the capillary 4 is lowered, in relative terms, by a distance $L_2$ from the state shown in FIG. 5(g). In this case, since the covered wire 1 is held (restrained) by the second clamper 2, the covered wire 1 is brought into the interior of the capillary 4 by a distance $L_2$, so that the tip of the covered wire 1 protrudes from the tip of the capillary 4 by a tail length $L_3$. In this case, the tail length L3 of the tip of the covered wire 1 corresponds to a part of the exposed portion 1d, from which the covering-film 1b has been removed.

Next, as shown in FIG. 5(i), the first clamper 3 is closed, and the second clamper 2 is opened; and the capillary 4 is raised to a ball forming level as shown in FIG. 5(j). Next, as shown by chain lines, the discharge electrode 8 is moved so that the electrode surface 8a for ball formation is positioned directly beneath the tip of the covered wire 1. Then, as shown in FIG. 5(k), a high voltage is applied across the discharge electrode 8 and covered wire 1, thus forming the ball 1c. Next, as shown by the chain lines, the discharge electrode 8 is returned to its original position. Then, the first clamper 3 is opened, and the capillary 4 is positioned above the next bonding point (see FIG. 5(a)). Afterward, the series of operations shown in FIGS. 5(a) through (k) are repeated.

The covering-film 1b of the covered wire 1 is made of a macromolecular resin material having electrical insulating properties such as a polyurethane, polyvinyl formallll, polyester, etc., or of a resin material combining such resins. Accordingly, the covering-film 1b has a certain degree of weak adhesive properties; and when the second clamper 2 is opened as shown in FIGS. 5(h) and 5(i), the covered wire 1 may stick to the clamping surface of the second clamper 2 as indicated by the chain lines. If the first clamper 3 and the capillary 4 are raised as shown in FIG. 5(j) while the covered wire 1 remains stuck to the second clamper 2, the covered wire 1 may buckle or flex in the direction parallel to the clamping surfaces of the second clamper 2 so that the covered wire 1 slips out of the second clamper 2, thus interfering with the continuity of bonding.

SUMMARY OF THE INVENTION

The object of the present invention is to provide a method for wire-bonding a covered wire which assures the continuity of bonding by preventing buckling of a covered wire or slipping off of a covered wire from a second clamper.

The first means of the present invention which solves the above-described problems is characterized in that in a method for wire-bonding a covered wire and comprises the steps of:

removing a covering-film located in an intended covering-film removal area of the covered wire which extends out from the tip of a capillary, closing a second clamper and opening a first clamper, and lowering the capillary and first clamper so as to bring the covered wire extending out from the tip of the capillary into the interior of the capillary, thus leaving the tip of the covered wire to protrude from the tip of the capillary by only a tail length, closing the first clamper and opening the second clamper, and raising the capillary and first clamper to a ball formation level, and forming a ball at the tip of the covered wire;

the covered wire is lowered so as to prevent the covered wire from sticking to the second clamper after the first clamper is closed and the second clamper is opened in the step of raising the capillary and first clamper to a ball formation level, and then the capillary and the first clamper are raised to the ball formation level.

The second means of the present invention which solves the above-described problems is characterized in that in a method for wire-bonding a covered wire and comprises the process which involves:

the steps of:

performing a second bonding operation on a second bonding point, raising a capillary and first clamper by a predetermined amount, closing the first clamper, and raising the capillary and first clamper so as to cut the covered wire from the base of the second bonding point, and raising the capillary and first clamper so that an intended covering-film removal area of the covered wire extending from the tip of the capillary faces a discharge electrode; and the steps of:

removing the covering-film located at the intended covering-film removal area of the covered wire extending from the tip of the capillary, closing the second clamper and opening the first clamper, and lowering the capillary and first clamper so as to bring the covered wire extending from the tip of the capillary into the interior of the capillary, thus leaving the tip of the covered wire to protrude from the tip of the capillary by only a tail length, closing the first clamper and opening the second clamper, and raising the capillary and the first clamper to a ball formation level, and forming a ball at the tip of the covered wire;

the covered wire is lowered so as to prevent the covered wire from sticking to the second clamper after the first clamper is closed and the second clamper is opened in the step of raising the capillary and first clamper to a ball formation level, and then the capillary and the first clamper are raised to the ball formation level, and the step of raising the capillary and the first clamper so that the intended covering-film removal area of the covered wire faces the discharge electrode includes:

raising the capillary and first clamper so that the intended covering-film remoaval area of the covered wire is positioned lower than the discharge electrode, lowering the capillary and the first clamper so as to pull down the covered wire, thus preventing the covered wire from sticking to the second clamper, and raising again the capillary and the first clamper so that the intended covering-film removal area faces the discharge electrode.

BRIEF DESCRIPTION OF THE DRAWINGS

FIG. 3 shows one example of the discharge electrodes; wherein FIG. 3(a) is a top view thereof, and FIG. 3(b) is a front view;

FIG. 4 shows another example of discharge electrodes; wherein FIG. 4(a) is a top view, and FIG. 4(b) is a from view.

DETAILED DESCRIPTION OF THE INVENTION

Figure 1:
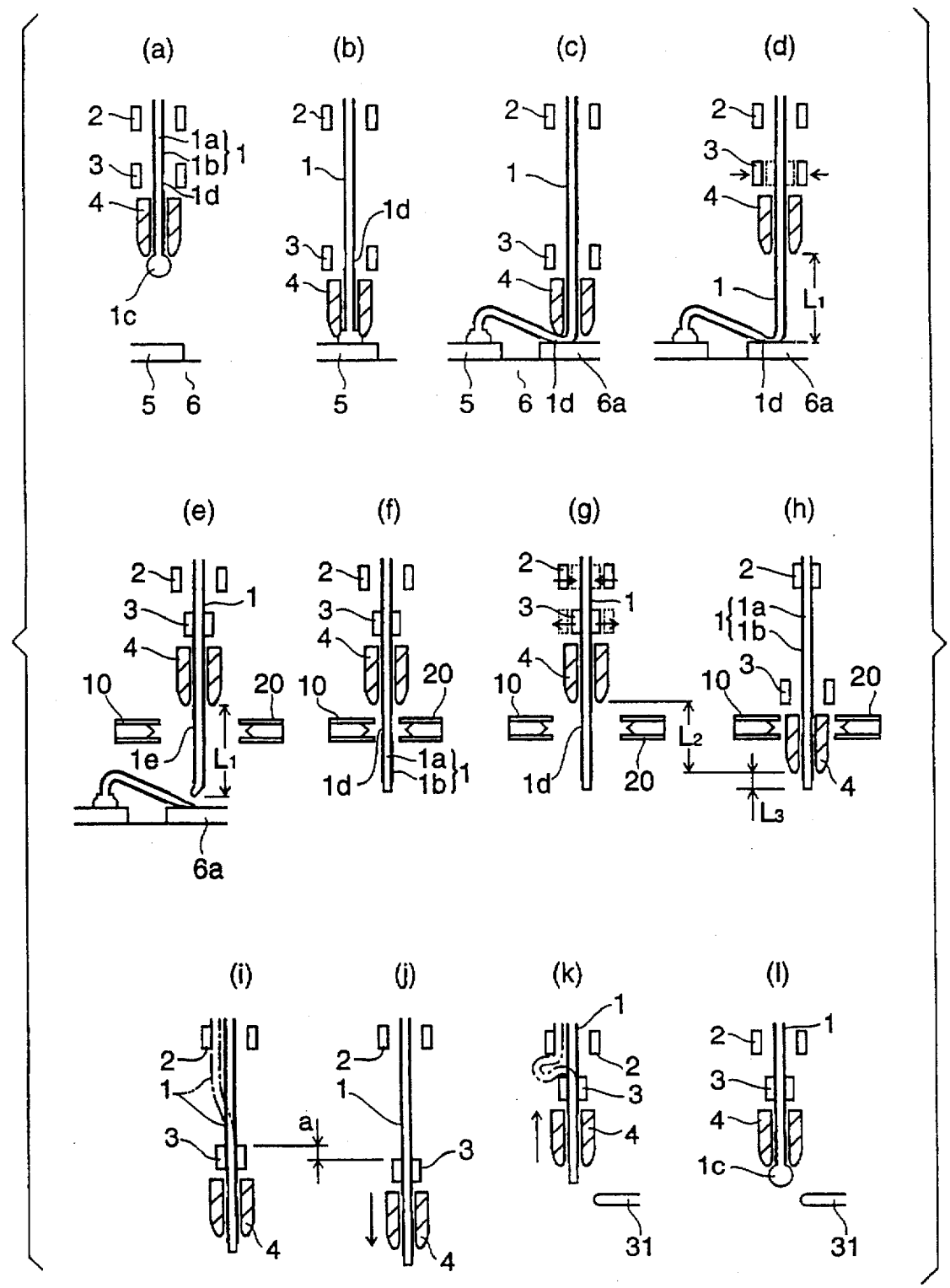
FIG. 1 is an explanatory diagrams which illustrate one embodiment of the method for wire-bonding a covered wire of the present invention.

One of the manners in which the present invention is practiced will be described with reference to FIG. 1. In this manner of practice, the covered wire 1 is prevented from sticking to the second clamper 2 at the time the first clamper 3 is closed and the second clamper 2 is opened as shown in FIG. 1(i), and the covered wire 1 is prevented from buckling or slipping from the second clamper 2 at the time the capillary 4 and the first clamper 3 are subsequently raised.

More specifically, after the first clamper 3 is closed and the second clamper 2 is opened as shown in FIG. 1(i), the first clamper 3 and the capillary 4 are lowered by the distance a. As a remit, even if the covered wire 1 should stick to the second clamper 2 as indicated by the chain lines, the covered wire 1 which is held by the first clamper 3 is lowered by the distance a by the descending motion of the first clamper 3, and the covered wire 1 is prevented from sticking to the second clamper 2. Accordingly, as shown in FIG. 1(k), even though the capillary 4 and the first clamper 3 are raised to a ball forming level, buckling of the covered wire, as indicated by the chain lines, and slipping of the covered wire 1 from the second clamper 2 can be prevented.

Another manner of practice of the present invention will be explained by way of FIG. 2. When the first clamper 3 is closed as shown in FIG. 1(d) and then raised as shown in FIG. 1(e), if the covered wire 1 should sticks to the clamping surface of the second clamper 2 in the step of FIG. 1(d), and the capillary 4 and the first clamper 3 are raised as shown in FIG. 1(e), then the covered wire 1 would buckle. In the other manner of practice of the present invention, it is possible to prevent such buckling of the covered wire 1 and slipping of the covered wire 1 from the second clamper 2.

More specifically, as shown in FIG. 2(a), the first clamper 3 closes and holds the covered wire 1, and then it is raised together with the capillary 4 in this closed state, so that the covered wire 1 is cut from the base area of the second bonding point as shown in FIG. 2(b), and the intended covering-film remoaval area 1e is raised so as to be positioned beneath the discharge electrodes 10 and 20. Then, as shown in FIG. 2(c), the first clamper 3 and the capillary 4 are lowered for the distance a, and then raised again so that the intended covering-film removal area 1e faces the discharge electrodes 10 and 20. Accordingly, even if the covered wire 1 should stick to the second clamper 2 in the step of FIG. 2(b), the covered wire 1 held by the first clamper 3 is pulled down for the distance a, and the covered wire 1 is prevented from sticking to the second clamper 2 because of the descending motion of the first clamper 3 in the step of FIG. 2(c).

Figure 3:
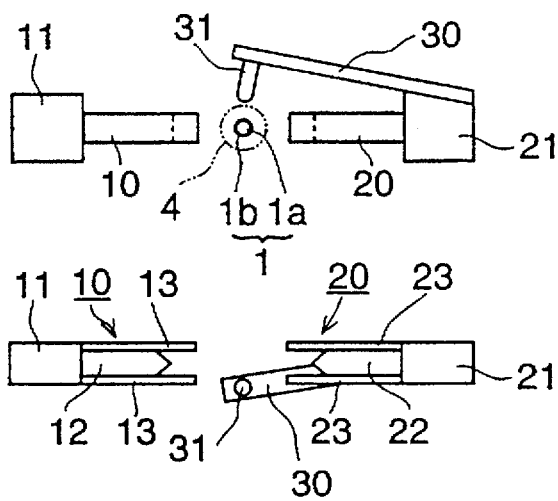
Figure 3:
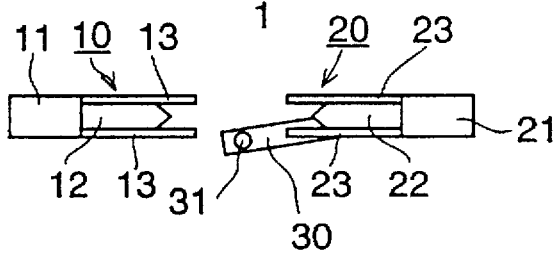
Figure 4:
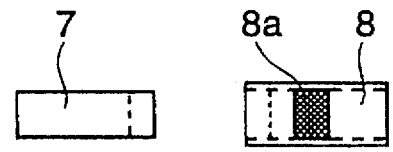
Figure 4:
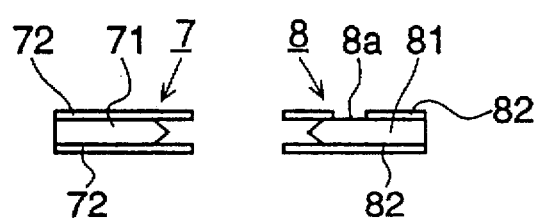
Figure 5:
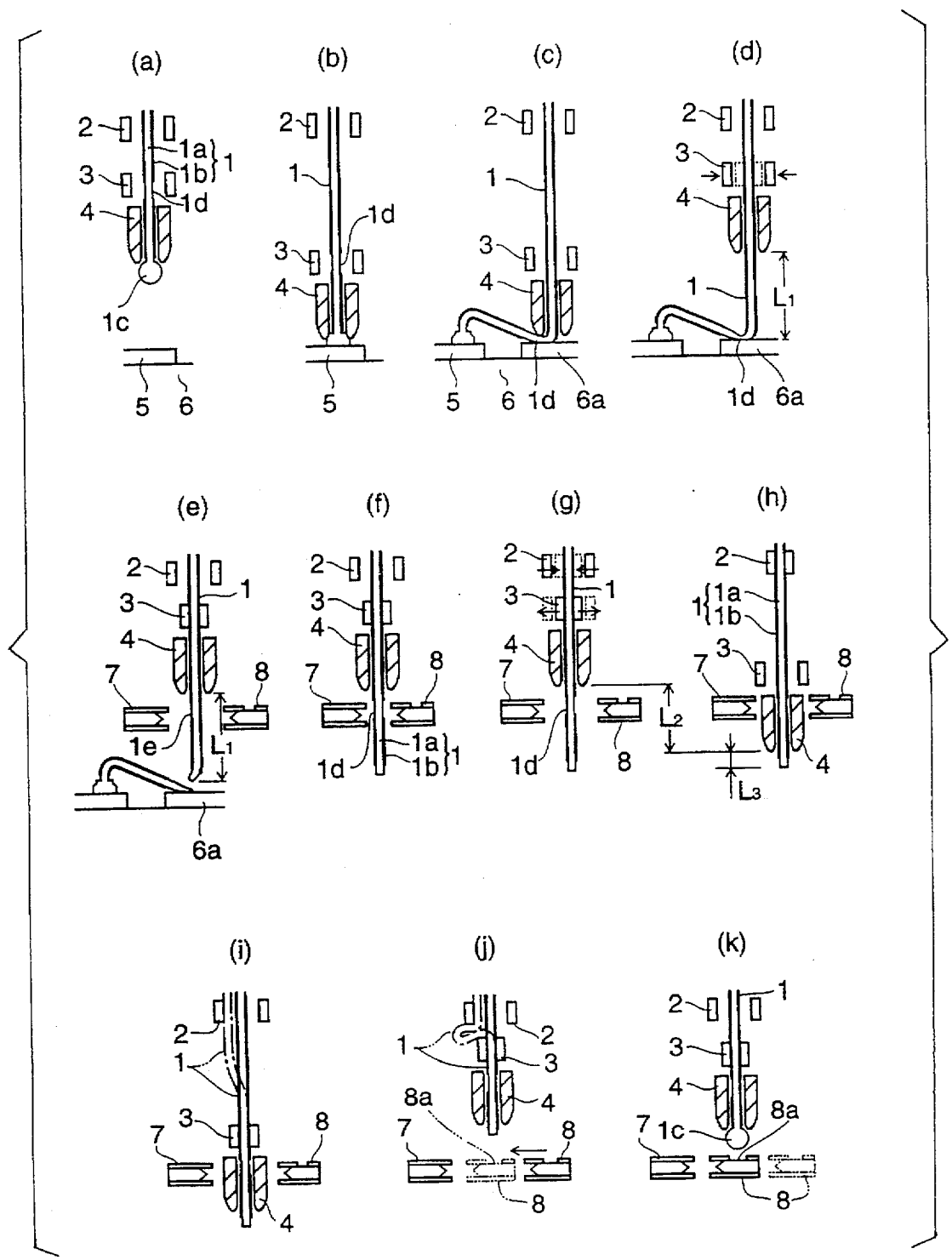
FIG. 5 is an explanatory diagrams which illustrate a conventional method for wire-bonding a covered wire.

An embodiment of the present invention is described with reference to FIGS. 1 and 3. Elements which are the same as in FIGS. 4 and 5 or correspond to elements in FIGS. 4 and 5 will be labeled with the same reference numerals. In this embodiment, the discharge electrodes shown in FIG. 3 are employed. As shown in FIG. 3, a pair of discharge electrodes 10 and 20 are fastened to respective electrode arms 11 and 21 and are driven toward and away from the covered wire 1 by a driving means which is not shown in the Figures. The discharge electrodes 10 and 20 have electromagnetic parts 12 and 22 as discharge terminals, and the upper and lower surfaces of these electromagnetic parts 12 and 22 are sandwiched by insulating parts 13, 13 and 23, 23. Conventionally, as shown in FIG. 4, an electrode surface $8a$ for ball formation, which is an exposed discharge surface, is formed on the upper surface of one of the discharge electrodes 8. However, in the discharge electrodes 10 and 20 shown in FIG. 3, no such electrode surface $8a$ for ball formation is formed. In other words, the pair of discharge electrodes 10 and 20 are used exclusively for removing the covering-film $1b$. Below, the discharge electrodes 10 and 20 will be referred to as "discharge electrodes for covering-film removal".

An electrode arm 30 is fastened to the electrode arm 21, and a discharge electrode 31 for ball formation is installed at the tip portion of the electrode arm 30. The discharge electrode 31 for ball formation is provided so as to be positioned to one side of the covered wire 1 at the time the discharge electrodes 10 and 20 are moved away from the covered wire 1 by a certain distance, for example, approximately 0.9 mm from the center of the covered wire 1 when the radius of the capillary 4 is 0.8 mm.

Next, the method for wire-bonding a covered wire is described with reference to FIG. 1. Furthermore, since FIGS. 1($a$) through 1($e$) are the same as FIGS. 5($a$) through 5($e$), a description of the processes illustrated in these figures is omitted. Moreover, since FIGS. 1($f$) through 1($i$) are the same as FIGS. 5($f$) through 5($i$), the processes illustrated in these Figures will be described only briefly. As shown in FIG. 1($e$), the covered wire 1 is cut at the second bonding position (exposed portion $1d$). In this case, the first clamper 3 and capillary 4 are raised so that the area of an intended covering-film removal area $1e$ of the covered wire 1 extending from the tip of the capillary 4 is positioned between the pair of discharge electrodes 10 and 20. Next, as shown in FIG. 1($f$), the pair of discharge electrodes 10 and 20 for covering-film removal are caused to move in close to the covered wire 1, in a non-contact state, from both sides. Then, a voltage is applied to the discharge electrodes 10 and 20 for covering-film removal so that a portion of the covering-film $1b$ on a predetermined area of the covered wire 1 is removed as in a conventional method, thus forming an exposed portion $1d$.

Next, as shown in FIG. 1($g$), the discharge electrodes 10 and 20 are withdrawn in the direction which causes the electrodes to move away from the covered wire 1 and then returned to their original positions. When the discharge electrodes 10 and 20 for covering-film removal thus return to their original positions, the discharge electrode 31 for ball formation moves together with the discharge electrodes 10 and 20 for covering-film removal and is positioned to one side of the covered wire 1 as shown in FIG. 3($a$). Then, as indicated by the chain lines, the second clamper 2 is closed and the first clamper 3 is opened. Afterward, the capillary 4 is lowered, in relative terms, by a distance of $L_2$ from the state shown in FIG. 1($h$). As a result, the covered wire 1 is brought into the interior of the capillary 4 by a distance of $L_2$, so that the tip of the covered wire 1 protrudes from the tip of the capillary 4 by a tail length of $L_3$.

Next, as shown in FIG. 1($i$), the first clamper 3 is closed and the second clamper 2 is opened. Then, as shown in FIG. 1($j$), the first clamper 3 and capillary 4 are lowered by a distance a. This lowering distance a is, for example, 0.1 to 0.5 min. As a result, even if the covered wire 1 should stick to the second clamper 2 as indicated by the two-dot chain line, the covered wire 1 is released from the second clamper 2, since the covered wire 1 held by the first clamper 3 is pulled downward by a distance a as a result of the descending movement of the first clamper 3. Accordingly, when the capillary 4 and the first clamper 3 are subsequently raised to the ball formation level, buckling of the covered wire 1 as indicated by the two-dot chain line in FIG. 1($k$) and slipping of the covered wire 1 from the second clamper 2 can be prevented.

When the capillary 4 and the first clamper 3 are raised to the ball formation level as shown in FIG. 1($k$), the tip of the covered wire 1 moves so as to be positioned beside the discharge electrode 31 for ball formation. Then, as shown in FIG. 1($l$), a high voltage is applied to the discharge electrode 31 for ball formation and the covered wire 1, so that a ball $1c$ is formed. Next, the first clamper 3 is opened, and the capillary 4 is positioned above the next bonding point (see FIG. 1($a$)). Afterward, the series of operations illustrated in FIGS. 1($a$) through 1($l$) is repeated.

Meanwhile, processes in which the first clamper 3 is closed and caused to rise while clamping the covered wire 1 also occur in the steps between FIG. 1($d$) and FIG. 1($e$). More specifically, in cases where the covered wire 1 sticks to the clamping surfaces of the second clamper 2 in the state shown in FIG. 1($d$), there is a danger that this may cause buckling, etc., of the covered wire 1 when the capillary 4 and first clamper 3 are raised as shown in FIG. 1($e$). Accordingly, it is preferable to add a step in which the first clamper 3 is lowered by a fixed amount as in the steps of FIGS. 1($d$) and 1($e$). However, since the ascending movements of the capillary 4 and first clamper 3 in this process are smaller than that in the steps of FIGS. 1($i$) and 1($k$), the effect on the covered wire 1 is smaller than in the above-described case. FIG. 2 illustrates the process involved. FIG. 2($a$) shows the state of FIG. 1($d$), and FIG. 2($c$) shows the state of FIG. 1($e$).

Figure 2:
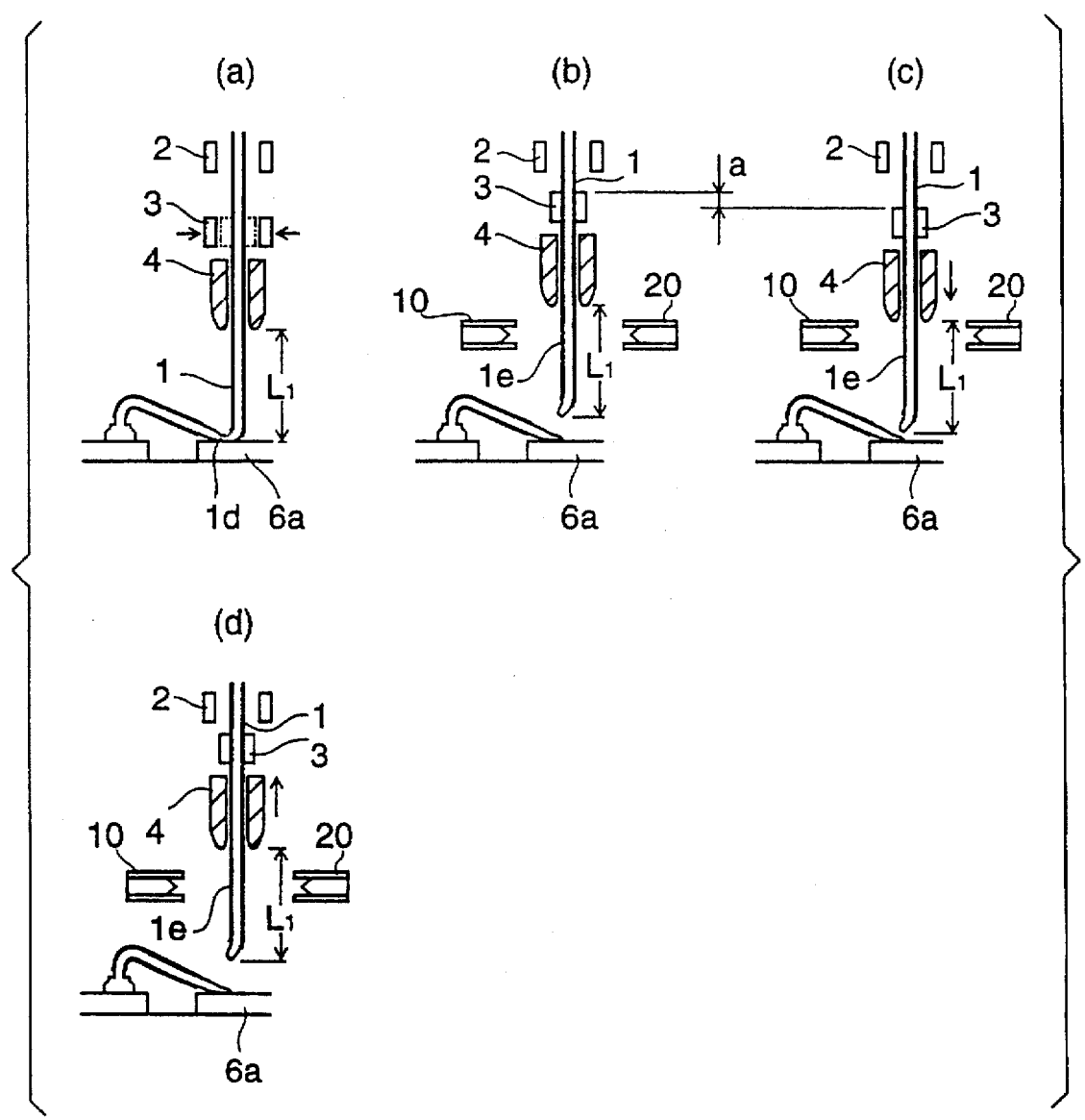
FIG. 2 is an explanatory diagrams which illustrate another embodiment of the method for wire-bonding a covered wire of the present invention.

As shown in FIG. 2($a$), the first clamper 3 is closed and raised together with the capillary 4 while holding the covered wire 1; as a result, the covered wire is cut from the base of the second bonding point as shown in FIG. 2($b$). This operation is the same as in a conventional method. However, in the present embodiment, the amount by which the capillary 4 and first clamper 3 are raised differs from that in a conventional method. In other words, in a conventional method, after the covered wire 1 is cut from the base of the second bonding point, the capillary 4 and the first clamper 3 are raised so that the area of intended covering-film removal area $1e$ of the covered wire 1 is positioned between the discharge electrodes 10 and 20. In the present embodiment, on the other hand, with the intended covering-film removal area $1e$ raised to a point below the level of the discharge electrodes 10 and 20 as shown in FIG. 2($b$), the first clamper 3 and the capillary 4 are lowered by a distance a as shown in FIG. 2($c$); then, as shown in FIG. 2($d$), the first clamper 3 and the capillary 4 are again raised so that the intended covering-film removal area $1e$ is positioned between the discharge electrodes 10 and 20. Accordingly, even if the covered wire should stick to the second clamper 2 in the step of FIG. 2($b$), the covered wire held by the first clamper 3 is pulled downward by a distance a as a result of the descending movement of the first clamper 3 shown in FIG. 2($c$), resulting in that the covered wire 1 is released from the second clamper 2.

Furthermore, in the embodiment described above, the discharge electrodes 10 and 20 shown in FIG. 3 are used.

However, since the structure of the discharge electrodes has no direct connection with the gist of the present invention, it goes without saying that it would also be possible to use the discharge electrodes 7 and 8 shown in FIG. 4 or to use some other discharge electrodes.

According to the present invention, after the first clamper is closed and the second clamper is opened in the step in which the capillary and the first clamper are raised to a ball formation level, the capillary and the first clamper are lowered, thus pulling the covered wire downward so that the covered wire does not stick to the second clamper; and then the capillary and the first clamper are raised to a ball formation level. Accordingly, the covered wire is prevented from buckling, and the covered wire is prevented from slipping off of the second clamper.

We claim:

1. A method for wire-bonding a covered wire comprising a process which includes the steps of:

removing a covering-film located at an intended covering-film removal area of the covered wire which extends out from a capillary, closing a second clamper and opening a first clamper, and lowering the capillary and first clamper so as to bring the covered wire extending out from the tip of the capillary into the interior of the capillary, thus leaving the tip of the covered wire to protrude from the tip of the capillary by only a tail length, closing the first clamper and opening the second clamper, and raising the capillary and first clamper to a ball formation level, and forming a ball at the tip of the covered wire;

wherein, after the first clamper is closed and the second clamper is opened in the step of raising the capillary and first clamper to the ball formation level, the capillary and first clamper are lowered so as to pull the covered wire downward, thus preventing the covered wire from sticking to the second clamper, and then the capillary and first clamper are raised to the ball formation level.

2. A method for wire-bonding a covered wire comprising:

a process which includes the steps of:

performing a second bonding operation on a second bonding point, raising a capillary and a first clamper by a predetermined amount, closing the first clamper, and raising the capillary and first clamper so as to cut the covered wire from a base of the second bonding point, and raising the capillary and first clamper so that an intended covering-film removal area of the covered wire extending from the tip of the capillary faces a discharge electrode; and a process which includes the steps of:

removing a covering-film located at the intended covering-film removal area of the covered wire extending from the tip of the capillary, closing a second clamper and opening the first clamper, and lowering the capillary and first clamper so as to bring the covered wire extending from the tip of the capillary into the interior of the capillary, thus leaving the tip of the covered wire to protrude from the tip of the capillary by only a tail length, closing the first clamper and opening the second clamper, and raising the capillary and first clamper to a ball formation level, and forming a ball at the tip of the covered wire;

wherein, after the first clamper is closed and the second clamper is opened in the step of raising the capillary and first clamper to the ball formation level, the capillary and first clamper are lowered so as to pull the covered wire downward, thus releasing the covered wire from sticking to the second clamper, and then the capillary and first clamper are raised to the ball formation level, and the step of raising the capillary and the first clamper so that the intended covering-film removal area of the covered wire faces the discharge electrode is executed by:

raising the capillary and the first clamper so that the intended covering-film remoaval area of the covered wire is positioned lower than the discharge electrode;

lowering the capillary and the first clamper so as to pull down the covered wire, thus preventing the covered wire from sticking to the second clamper, and raising again the capillary and first clamper so that the intended covering-film removal area faces the discharge electrode.

* * * * *